United States Patent
Wang

(10) Patent No.: US 9,142,279 B2
(45) Date of Patent: *Sep. 22, 2015

(54) DRAM REFRESH METHOD AND SYSTEM

(71) Applicant: INPHI CORPORATION, Santa Clara, CA (US)

(72) Inventor: David Wang, Thousand Oaks, CA (US)

(73) Assignee: Inphi Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/242,292

(22) Filed: Apr. 1, 2014

(65) Prior Publication Data

US 2014/0215142 A1 Jul. 31, 2014

Related U.S. Application Data

(63) Continuation of application No. 13/460,307, filed on Apr. 30, 2012, now Pat. No. 8,711,647.

(60) Provisional application No. 61/483,868, filed on May 9, 2011.

(51) Int. Cl.
*G11C 7/00* (2006.01)
*G11C 11/406* (2006.01)

(52) U.S. Cl.
CPC .... *G11C 11/40607* (2013.01); *G11C 11/40618* (2013.01)

(58) Field of Classification Search
CPC .................. G11C 11/406; G11C 11/40615
USPC ............................................. 365/222, 189.05
See application file for complete search history.

(56) References Cited

U.S. PATENT DOCUMENTS

| 7,020,038 B2 * | 3/2006 | Shieh | 365/222 |
| 7,057,961 B2 * | 6/2006 | Perner | 365/222 |
| 8,711,647 B2 * | 4/2014 | Wang | 365/222 |

\* cited by examiner

*Primary Examiner* — Son Dinh
(74) *Attorney, Agent, or Firm* — Koppel, Patrick, Heybl & Philpott

(57) ABSTRACT

A DRAM refresh method used with a memory system organized into rows of memory cells, each of which has an associated data retention time, with the system arranged to refresh predefined blocks of memory cells simultaneously. For each block of memory cells that are to be refreshed simultaneously, the minimum data retention time for the memory cells in the block is determined. Then, an asymmetric refresh sequence is created which specifies the order in which the blocks of memory cells are refreshed, such that the blocks having the shortest minimum data retention times are refreshed more often than the blocks having longer minimum data retention times.

18 Claims, 4 Drawing Sheets

FIG. 2

| Block Address | Min Retention Times for Each Block (ms) | Refreshes per 256 ms | |
|---|---|---|---|
| | | Baseline Algorithm | New Algorithm |
| 0 | 50 | 4 | 8 |
| 1 | 100 | 4 | 4 |
| 2 | 400 | 4 | 1 |
| 3 | 200 | 4 | 2 |
| 4 | 400 | 4 | 1 |
| 5 | 25 | 4 | 16 |
| 6 | 400 | 4 | 1 |
| 7 | 400 | 4 | 2 |
| 8 | 200 | 4 | 2 |
| 9 | 50 | 4 | 8 |
| 10 | 100 | 4 | 4 |
| 11 | 200 | 4 | 2 |
| 12 | 50 | 4 | 8 |
| 13 | 200 | 4 | 2 |
| 14 | 400 | 4 | 2 |
| 15 | 800 | 4 | 1 |
| Sum | | 64 | 64 |

| FIG. 4-1 | FIG. 4-2 |
|---|---|

| Loop ID | 0 | | 1 | | 2 | | 3 | | 4 | | 5 | | 6 | | 7 | |
|---|---|---|---|---|---|---|---|---|---|---|---|---|---|---|---|---|
| Block Address | Next Loop | Next Block | Next Loop | Next Block | Next Loop | Next Block | Next Loop | Next Block | Next Loop | Next Block | Next Loop | Next Block | Next Loop | Next Block | Next Loop | Next Block |
| 0 | 0 | 5 | | | 2 | 5 | | | 4 | 5 | | | 6 | 5 | | |
| 1 | | | 1 | 7 | | | | | | | 5 | 14 | | | | |
| 2 | | 9 | | | | | | | | | | | 7 | 9 | | |
| 3 | 1 | | | | | | | | | | | | | | | |
| 4 | | | | | | | | | | | | | | | 8 | 0 |
| 5 | 0 | 12 | 1 | 1 | 2 | 12 | 3 | 10 | 4 | 12 | 5 | 1 | 6 | 12 | 7 | 10 |
| 6 | | | | | | | | | | | | | | | | |
| 7 | | | 2 | 0 | 3 | 9 | | | | | | | | | | |
| 8 | | | 1 | 5 | | | 3 | 5 | | | 5 | 5 | | | 7 | 5 |
| 9 | | | | | | | 3 | 11 | | | | | | | 7 | 4 |
| 10 | | | | | | | 4 | 0 | | | | | | | | |
| 11 | | | | | | | | | | | | | | | | |
| 12 | 0 | 3 | | | 2 | 8 | | | 4 | 13 | | | 6 | 2 | | |
| 13 | | | | | | | | | 5 | 9 | | | | | | |
| 14 | | | | | | | | | | | 6 | 0 | | | | |
| 15 | | | | | | | | | | | | | | | | |

FIG. 4-2

| | 8 | | 9 | | 10 | | 11 | | 12 | | 13 | | 14 | | 15 | |
|---|---|---|---|---|---|---|---|---|---|---|---|---|---|---|---|---|
| | Next Loop | Next Block | Next Loop | Next Block | Next Loop | Next Block | Next Loop | Next Block | Next Loop | Next Block | Next Loop | Next Block | Next Loop | Next Block | Next Loop | Next Block |
| | 8 | 5 | | | 10 | 5 | | | 12 | 5 | | | 14 | 5 | | |
| | | | 9 | 7 | | | | | | | 13 | 14 | | | | |
| | 9 | 9 | | | | | | | | | | | | | | |
| | 8 | 12 | 9 | 1 | 10 | 12 | 11 | 10 | 12 | 12 | 13 | 1 | 14 | 12 | 15 | 10 |
| | | | 10 | 0 | 11 | 9 | | | | | | | 15 | 9 | | |
| | | | 9 | 5 | | | 11 | 5 | | | 13 | 5 | | | 15 | 5 |
| | | | | | | | 11 | 11 | | | | | | | 15 | 15 |
| | | | | | | | 12 | 0 | | | | | | | | |
| | | | | | 10 | 8 | | | 12 | 13 | | | 14 | 6 | | |
| | 8 | 3 | | | | | | | 13 | 9 | | | | | | |
| | | | | | | | | | | | 14 | 0 | | | 0 | 0 |

DRAM REFRESH METHOD AND SYSTEM

RELATED APPLICATIONS

This application is a Continuation of U.S. utility application Ser. No. 13/460,307, filed Apr. 30, 2012, still pending, which claimed the benefit of provisional patent application No. 61/483,868 to David Wang, filed May 9, 2011.

BACKGROUND OF THE INVENTION

1. Field of the Invention

This invention relates generally to memory systems that employ DRAM, and more particularly to methods and systems for handling the refreshing of DRAM memory cells.

2. Description of the Related Art

A typical DRAM memory cell consists of an access transistor and a storage capacitor, with the access transistor connecting the storage capacitor to a bitline when switched on such that the capacitor stores the logic value placed on the bitline. Due to the tendency of a capacitor to lose its charge over time, DRAM memory cells must be periodically 'refreshed', which serves to maintain the value stored in each storage capacitor at its desired value. The amount of time that a cell can retain its logic value is referred to as its "data retention time".

One trend in the development of memory cells is that the cells have been shrinking due to advancements in process technology and the demand for ever larger memory capacity. This necessarily results in a reduction in the sizes of the access transistor and storage capacitor, which can lead to several problems. For example, each access transistor exhibits leakage which acts to slowly drain stored charge from the storage capacitor. This leakage characteristic—and thus each cell's data retention time—varies from transistor to transistor; however, this variability increases as the size of the access transistors is reduced. Another problem is that a shrinking memory cell results in a smaller storage capacitor, and thus a reduced storage capacitance. This can also adversely affect the data retention time characteristics of the cells.

These problems combine to result in the number of 'weak' memory cells—i.e., cells that have a below-average data retention time—increasing as the cells become smaller. Since DRAM is refreshed on a periodic basis, the weak cells having retention times shorter than the refresh period may lose their stored values. One way of avoid this is to provide a number of redundant memory cells, which can be accessed via a mapping process that would typically be built into the DRAM. However, the redundant cells and mapping logic consume extra area within the DRAM, and the mapping process can increase the DRAM's access time; the amount of overhead required for this solution may be unacceptably high.

SUMMARY OF THE INVENTION

The present invention is directed to a DRAM refresh method and system which overcomes the problems noted above, providing a means of accommodating weak memory cells without incurring excessive amounts of overhead.

The present DRAM refresh method is used with a memory system organized into rows of memory cells, each of which has an associated "data retention time", with the memory system arranged to refresh predefined blocks of memory cells simultaneously. The data retention time of a given row is equal to the smallest data retention time of all cells in that given row. The method requires that for each predefined block of memory cells that are to be refreshed simultaneously, the minimum data retention time for the memory cells in the block be determined. In the context of this discussion, each predefined "block" consists of one or more rows of memory cells. Then, with the minimum retention time data known for each block, an asymmetric refresh sequence is created which specifies the order in which the blocks of memory cells are refreshed, such that the blocks of memory cells having the shortest minimum data retention times are refreshed more often than the blocks of memory cells having longer minimum data retention times.

In this way, a memory system which must comply with a particular refresh protocol that specifies, for example, that x refresh commands must be executed every y ms, can continue to comply with the protocol, but now rather than each block being refreshed an equal number of times every y ms, the blocks containing the weaker cells will be refreshed more often every y ms than those blocks containing the stronger cells.

These and other features, aspects, and advantages of the present invention will become better understood with reference to the following description and claims.

BRIEF DESCRIPTION OF THE DRAWINGS

FIG. 2 is an example of a table listing the minimum data retention times for each of 16 blocks of memory cells, and the number of refreshes scheduled for each block within a predetermined time period in accordance with a conventional refresh sequence, and in accordance with an asymmetric refresh sequence as described herein.

FIG. 4 is an example of a table which implements an asymmetric refresh sequence for 16 blocks of memory cells in accordance with the present invention.

DETAILED DESCRIPTION OF THE INVENTION

Figure 1:
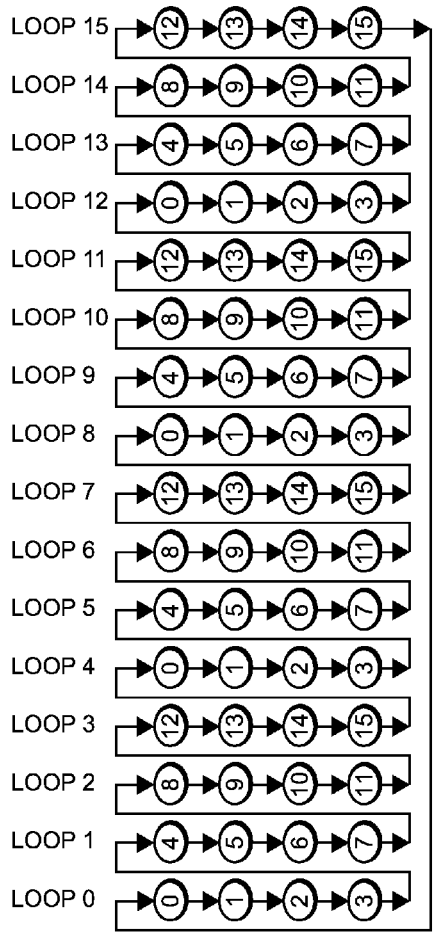
FIG. 1 is a diagram of an exemplary conventional refresh sequence for 16 blocks of memory cells.

The present DRAM refresh method is used with a memory system organized into rows of memory cells, each of which has an associated data retention time, with the memory system arranged to refresh predefined blocks of memory cells simultaneously. As noted above, the data retention times of 'weak' memory cells are shorter than those of 'average' memory cells, and may be shorter than the refresh period used by a conventional refresh scheme. The present method overcomes this problem by devising a new refresh scheme, in which blocks of memory cells having shorter minimum data retention times get refreshed more often within a prescribed time than blocks of memory cells having longer minimum data retention times. When so arranged, 'weak' memory cells may not need to be replaced, but are instead refreshed more often than they would be using a conventional refresh scheme and thus remain usable.

A conventional DRAM refresh scheme specifies the number of cells that are to be refreshed simultaneously—referred to herein as a 'block' of cells and typically consisting of one or more rows of cells, and how often a given block is to be refreshed within a given time period. A block of cells is typically refreshed in response to a refresh command, with refresh commands issued by a controller that typically, though not necessarily, resides onboard the DRAM; thus, a given refresh protocol will typically require that the refresh controller issue x refresh commands every y ms. For example, for a DRAM organized into 'banks' of memory cells, a particular DRAM refresh scheme may require that the refresh controller issue 8192 refresh commands every 64 ms, with each refresh command refreshing N rows of memory cells per bank, with N given by:

$N$=rows-per-bank/8192.

For example, a JEDEC standard 4 Gb DDR3 DRAM device has $2^{16}$ rows per bank. N would then be given by:

$N=2^{16}/8192=8$.

Thus, this refresh scheme requires that each refresh command refresh 8 rows of memory cells in each bank. As such, 8 rows of memory cells would constitute a 'block' or 'predefined block' of cells as defined herein. In this way, each row of memory cells in the DRAM is refreshed once every 64 ms.

Being refreshed once every 64 ms is likely to be acceptable for most memory cells. However, as noted above, some cells are weaker than others, and may have a data retention time of less than 64 ms. If this is the case, the data value stored in the cells may degrade and be lost before the cell is refreshed.

The present method overcomes this problem by devising a new refresh scheme, in which blocks of memory cells having shorter minimum data retention times get refreshed more often within the prescribed time than blocks of memory cells having longer minimum data retention times. An example is now presented to illustrate the operation of the method. Assume that a DRAM bank to be refreshed consists of 16 blocks of memory cells, with each block consisting of multiple rows of cells. The refresh protocol for this example requires that each of the 16 blocks of cells in the bank is to be refreshed once every 64 ms. Thus, in 256 ms, each block is to be refreshed 4 times.

A diagram illustrating a conventional refresh sequence for this example is shown in FIG. 1, which depicts a typical refresh sequence for the 16 blocks over a period of 256 ms. The refresh sequence is illustrated in terms of 16 loops, with 4 refresh commands per loop. The sequence begins by refreshing block 0, followed by block 1, block 2, etc., up to block 15. The sequence then continues back at block 0 and continues as before up to block 15. This is repeated twice more, so that at the end of 256 ms, each block has been refreshed 4 times.

FIG. 2 is an exemplary table which minimum data retention times that might be measured for each of the 16 blocks referenced in FIG. 1. As can be seen, some blocks include weak cells and thus have smaller minimum data retention times (e.g., 25 or 50 ms), while the minimum data retention times for other blocks are 100 ms or more. Note that 4 of the blocks have minimum data retention times that are less than 64 ms; since the conventional refresh scheme of FIG. 1 refreshes each block just once every 64 ms, the weakest cells within those 4 blocks may lose their stored data value before they are refreshed.

The determination of minimum data retention time for the cells in a block may be accomplished by external test circuitry, though this approach may be unacceptably expensive and time-consuming. The determination of minimum data retention times is preferably accomplished using built-in testing capability that resides on the memory module—typically a DIMM—on which the DRAM is located. For example, some DRAM memory modules also include a memory buffer, which acts as an interface between a host controller and the DRAM. The memory buffer may be, for example, a device such as the iMB (isolating Memory Buffer) from Inphi Corporation. Memory buffers of this sort are described, for example, in co-pending U.S. patent application Ser. Nos. 12/267,355 and 12/563,308. The memory buffer preferably includes a testing capability able to determine the minimum data retention times needed to implement the present refresh method, using testing methods which are outside the scope of this discussion but which are well-known to those familiar with memory devices. For example, the MemBIST circuitry found in some memory buffers may be used as a low-cost test platform which can be used to characterize DRAM data retention times. This approach would be considerably more efficient and practical than would the use of external test circuitry.

The table in FIG. 2 also shows the number of refreshes each block will receive in 256 ms when using the conventional scheme of FIG. 1 ("baseline algorithm"), and when using the new refresh scheme described herein ("new algorithm"). As discussed above, blocks containing cells having weaker data retention times are refreshed more often than blocks containing cells having stronger data retention times. For example, block 0 includes at least one cell with a data retention time of 50 ms. Rather than refresh this block 4 times every 256 ms, it is refreshed 8 times in 256 ms, thereby ensuring that none of the cells in block 0 will lose their stored value. The total number of refreshes in a given time period is preferably the same under the new refresh scheme as it is under a convention scheme; however, this is not essential, and other approaches might be available that are more efficient. One possible approach which results in a relatively easy implementation requires that the number of refreshes for each block per 256 ms be a power of 2. This is just one possible implementation, however, and is not essential. The present method only requires that an asymmetric refresh sequence be created which specifies the order in which blocks of memory cells are refreshed, such that blocks of memory cells having the shortest minimum data retention times are refreshed more often than blocks of memory cells having longer minimum data retention times.

Figure 3:
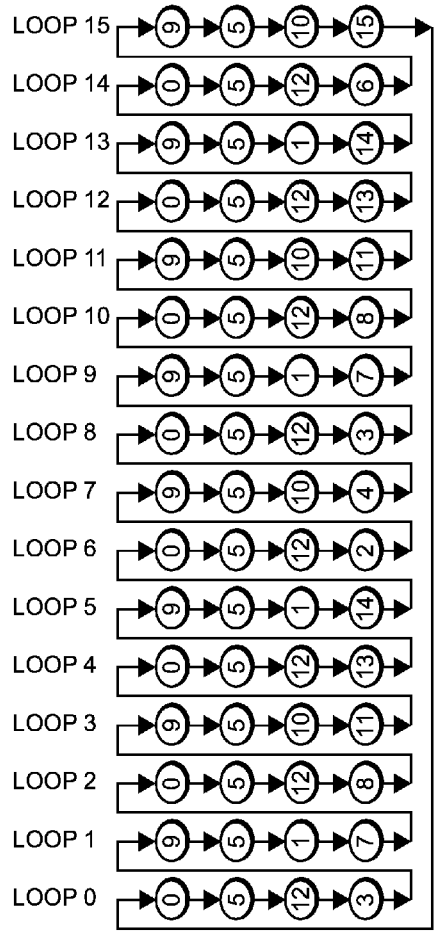
FIG. 3 is a diagram of an exemplary asymmetric refresh sequence for 16 blocks of memory cells in accordance with the present invention.

One possible asymmetric refresh sequence that might result from the data in FIG. 2 is shown in FIG. 3. As with FIG. 1, the refresh sequence is illustrated in terms of 16 loops, with 4 refresh commands per loop. Here, however, rather than each block being refreshed 4 times in 256 ms, the number of times each block is refreshed is governed by the table in FIG. 2. Thus, blocks containing weaker cells such as blocks 0, 5, 9 and 12 are refreshed 8 or more times in 256 ms, and thus appear more often in FIG. 3 than blocks containing stronger cells such as blocks 2, 4, 6 and 15, which are refreshed just 1 time in 256 ms and thus appear just once in FIG. 3.

Note that the table in FIG. 2 and the asymmetric refresh sequence shown in FIG. 3 are merely exemplary. For the present method, it is only required that blocks with weaker cells are refreshed more often within a given time period than blocks containing stronger cells.

The asymmetric refresh sequence that results from the present method might be stored in numerous way. For example, the sequence might be stored in an EPROM or similar fuse-based device that resides on the memory module; alternatively, the refresh sequence might be loaded into a DRAM device by the memory buffer at boot time, or stored in non-data-containing DRAM located in rows that get refreshed (and are therefore also tested to determine minimum data retention times).

A refresh sequence of the sort shown in FIG. 3 is in the form of a 'linked list' structure, which is traversed to execute the asymmetric refresh sequence. However, it is not essential that the asymmetric refresh sequence be stored as a linked list; it might alternatively be stored in the form of, for example, a FAT tree structure or a binary tree structure.

One way in which the asymmetric refresh sequence of FIG. 3 might be implemented is illustrated in the table shown in FIG. 4. The 16 blocks are listed down the side of the table, and the 16 refresh loops are listed along the top of the table. The columns under each loop ID dictate the sequence in which the refresh commands are executed, by specifying the ID of the next block to be refreshed, as well as the ID of the next loop (the 'next loop index'). In operation, the sequence would begin at block 0, loop 0, with block 0 being refreshed. The table indicates that the next block to refresh is block 5 (with the next loop index being 0), so block 5 is refreshed next. The table dictates that block 12 is refreshed next (next loop index 0), followed by block 3. After block 3 is refreshed, the table specifies that the next block to refresh is block 9, with the next loop index being 1—thus initiating the second loop of the refresh sequence. After block 9 is refreshed, the table directs the sequence to block 5 (next loop index 1). The execution of the asymmetric refresh sequence continues in this way until the final refresh of block 15 (in loop ID 15), at which point the sequence reverts back to block 0, loop 0 and begins again.

The present methods and systems may be implemented in different ways for different systems. Several implementations are described herein as illustrative examples; the examples should not be construed as limiting the present invention in nature. For example, the system could be implemented with a memory system that employs a DIMM form factor and which is in compliance with the load-reduced DIMM (LRDIMM), registered DIMM (RDIMM), unregistered DIMM (UDIMM), non-volatile DIMM (NV-DIMM) or any DDR interface standard specifications, or a form factor other than a DIMM. That is, the systems and methods described herein are not limited to use with a particular form factor or system topology, and can be adapted to cover future changes in system topology and organization.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of operating a DRAM, the method comprising:
    refreshing the DRAM in a memory system organized into rows of memory cells, each of said cells having an associated data retention time, said memory system arranged to refresh predefined blocks of said memory cells simultaneously;
    for each predefined block of memory cells that are to be refreshed simultaneously, determining a minimum data retention time for the memory cells in each of the predefined blocks; and
    creating an asymmetric refresh sequence which specifies the order in which said blocks of memory cells are to be refreshed, such that said blocks of memory cells having the shortest minimum data retention times are refreshed more often than the blocks of memory cells having longer minimum data retention times.

2. The method of claim 1, wherein each of said blocks of memory cells comprises one or more rows of memory cells.

3. The method of claim 1, further comprising refreshing said blocks of memory cells in accordance with said asymmetric refresh sequence.

4. The method of claim 1, wherein each of said blocks of memory cells is refreshed in response to a respective refresh command.

5. The method of claim 1, wherein each of said blocks of memory cells is refreshed in response to a respective refresh command, further comprising refreshing said blocks of memory cells in accordance with said asymmetric refresh sequence, wherein said memory system must comply with a requirement that x refresh commands be executed every y ms, said method arranged such that x refresh commands are executed every y ms.

6. The method of claim 5, wherein said asymmetric refresh sequence is arranged such that the number of times that each block of memory cells is refreshed in y ms is equal to a power of 2.

7. The method of claim 5, wherein each of said blocks of memory cells is a bank of memory cells comprising R rows, said memory system arranged such that each refresh command refreshes N rows, where N=R/8192.

8. The method of claim 5, wherein said memory system must comply with a requirement that 8192 refresh commands be executed every 64 ms.

9. The method of claim 1, wherein said DRAM reside on a memory module which includes a memory buffer that operates as an interface between a host controller and said DRAM, said minimum data retention times determined for said blocks of memory cells using test circuitry contained within said memory buffer.

10. The method of claim 9, wherein said test circuitry comprises MemBIST circuitry.

11. The method of claim 9, wherein said asymmetric refresh sequence is stored in DRAM that resides on said memory module.

12. The method of claim 9, wherein said asymmetric refresh sequence is stored in DRAM by said memory buffer at boot time.

13. The method of claim 1, wherein said asymmetric refresh sequence is stored in an EPROM device.

14. The method of claim 1, wherein said asymmetric refresh sequence is stored as a linked list structure.

15. The method of claim 1, wherein said asymmetric refresh sequence is stored as a FAT tree structure.

16. The method of claim 1, wherein said asymmetric refresh sequence is stored as a binary tree structure.

17. The method of claim 1, wherein said asymmetric refresh sequence is stored in non-data-containing DRAM, in rows that get refreshed.

18. The method of claim 1, wherein each of said blocks of memory cells is refreshed in response to a respective refresh command, each of said predefined memory blocks that is to be refreshed has an associated ID, and said asymmetric refresh sequence comprises a plurality of loops with a predetermined number of refresh commands per loop, each loop having an associated ID, further comprising creating a table which specifies:
    the ID of the next predefined memory block to be refreshed; and
    the ID of the next loop.

* * * * *